United States Patent [19]
Tihanyi et al.

[11] Patent Number: 6,124,612
[45] Date of Patent: Sep. 26, 2000

[54] FET WITH SOURCE-SUBSTRATE CONNECTION AND METHOD FOR PRODUCING THE FET

[75] Inventors: Jenoe Tihanyi, Kirchheim; Wolfgang Werner, München, both of Germany

[73] Assignee: Siemens Aktiengesellschaft, Munich, Germany

[21] Appl. No.: 09/395,302

[22] Filed: Sep. 13, 1999

Related U.S. Application Data

[63] Continuation of application No. PCT/DE98/03683, Dec. 15, 1998.

[30] Foreign Application Priority Data

Jan. 15, 1998 [DE] Germany ............ 198 01 313

[51] Int. Cl.⁷ ............................................. H01L 29/72
[52] U.S. Cl. .................. 257/330; 257/327; 257/329; 257/331; 257/332; 257/712; 257/713; 257/720
[58] Field of Search .............................. 257/327, 329, 257/330, 331, 332, 712, 713, 720

[56] References Cited

U.S. PATENT DOCUMENTS 5,945,708 8/1999 Tihanyi .......................... 257/330

*Primary Examiner*—Edward Wojciechowicz
*Attorney, Agent, or Firm*—Herbert L. Lerner; Laurence A. Greenberg; Werner H. Stemer

[57] ABSTRACT

An FET with a source-substrate connection (source-down FET) and a trench gate includes a drain zone of a first conductivity type provided on a first surface of a semiconductor layer of the first conductivity type that is disposed on a semiconductor substrate of the first conductivity type. The trench gate substantially penetrates the semiconductor layer. A source zone of the first conductivity type is provided at an end of the trench on a second surface of the semiconductor layer. A semiconductor zone of the second conductivity type is provided in a region next to the trench on the second surface of the semiconductor layer. The semiconductor zone has a surface which forms the second surface of the semiconductor layer together with the surface of the source zone. A method for producing the FET is also provided.

26 Claims, 5 Drawing Sheets

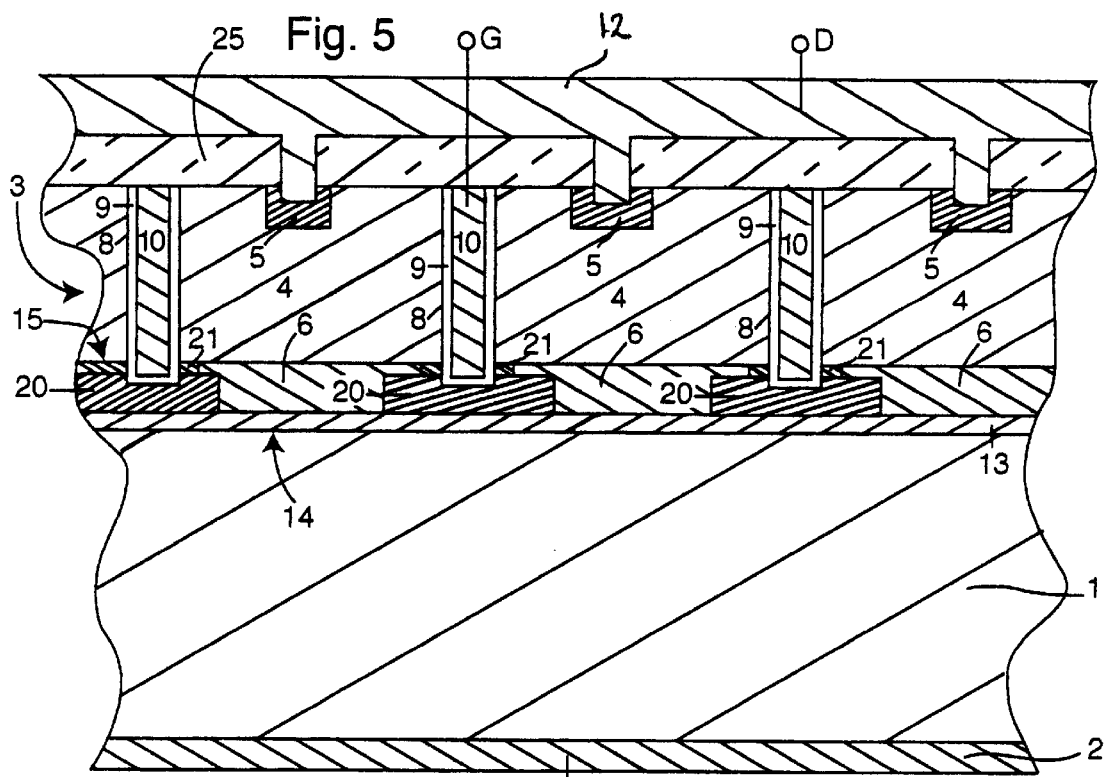
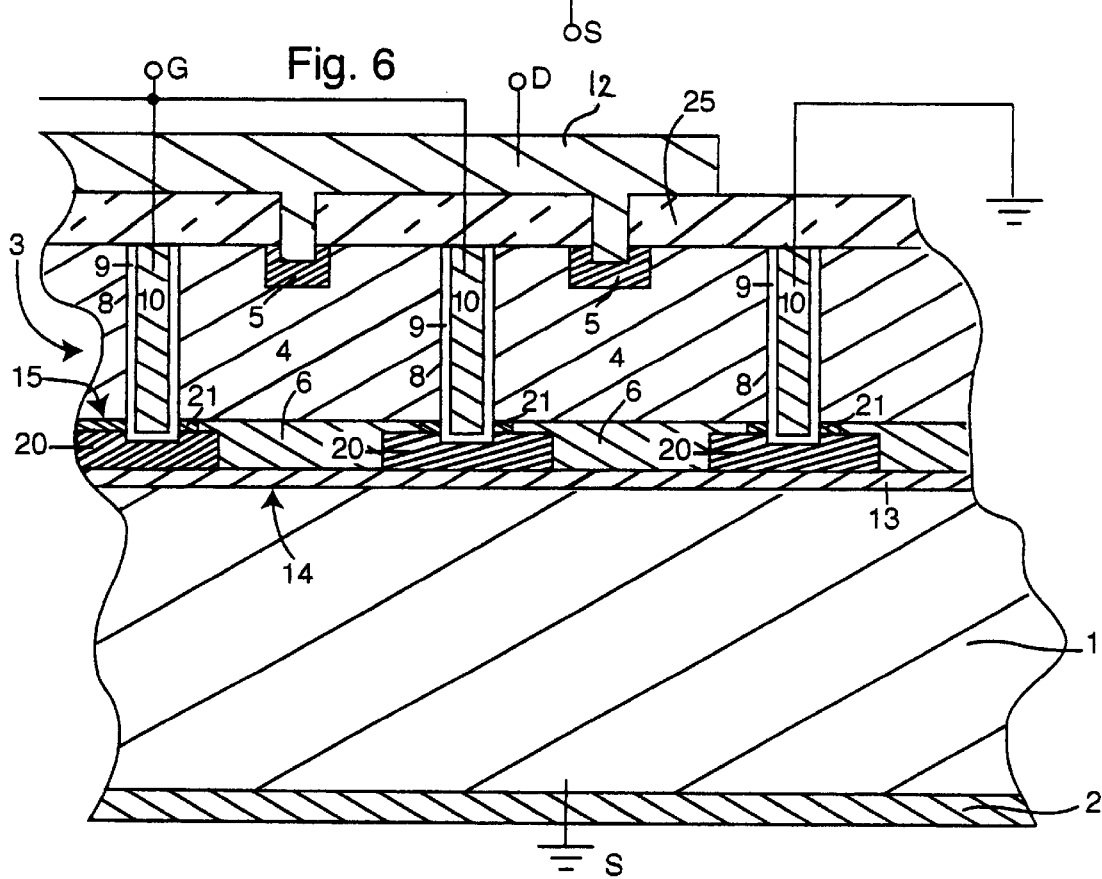

FET WITH SOURCE-SUBSTRATE CONNECTION AND METHOD FOR PRODUCING THE FET

CROSS-REFERENCE TO RELATED APPLICATION

This application is a continuation of copending International Application No. PCT/DE98/03683, filed Dec. 15, 1998, which designated the United States.

BACKGROUND OF THE INVENTION

Field of the Invention

The present invention relates to an FET (field effect transistor) with a source-substrate connection ("source-down FET") and a trench gate, including a drain zone of a first conductivity type provided on a first surface of a semiconductor layer of the first conductivity type which is disposed on a semiconductor substrate of the first conductivity type; the trench gate substantially penetrates the semiconductor layer; a source zone of the first conductivity type is provided at an end of the trench on a second surface of the semiconductor layer; and a semiconductor zone of the second conductivity type which is provided in a region next to the trench on the second surface of the semiconductor layer has a surface forming the second surface of the semiconductor layer together with the surface of the source zone. The invention also relates to a method for producing the FET.

FETs with a source-substrate connection have major advantages in terms of their cooling, because the cooling can be carried out by way of the silicon semiconductor substrate to which a voltage of 0 V is applied. It is thus possible, for instance, for an FET with a source-substrate connection to be screwed directly to the body of a vehicle, so that excellent heat dissipation is provided for.

U.S. Pat. No. 5,023,196 describes a MOSFET with a source-substrate connection and trench gate in which a first semiconductor layer of the second conductivity type and a second semiconductor layer of the first conductivity type are applied epitaxially over a semiconductor substrate of the first conductivity type, and a trench for the gate electrode is etched into those semiconductor layers down as far as the semiconductor substrate. The trench is lined with an insulating layer and is provided with a gate electrode. A source electrode is disposed on the surface of the semiconductor substrate opposite the trench, while a drain electrode is mounted in the region of the semiconductor layer of the first conductivity type, above a highly doped region of the first conductivity type.

Quite recently, so-called wafer bonding, in which two semiconductor wafers, one of which can be called a substrate, are joined together, has proved to be especially expedient for the production of semiconductor components and integrated circuits. If an FET with a source-substrate connection that is produced by wafer bonding is then desired, a construction of a connecting layer between the two wafers, and in particular a short circuit between the source zone provided in the lower region of the trench, and the semiconductor zone of the second conductivity type or so-called "body zone", is problematic.

SUMMARY OF THE INVENTION

It is accordingly an object of the invention to provide an FET and a method for producing the FET, which overcome the hereinafore-mentioned disadvantages of the heretofore-known devices and methods of this general type, in which the FET has a source-substrate connection and a trench gate and in which the method can be performed by wafer bonding.

With the foregoing and other objects in view there is provided, in accordance with the invention, an FET with a source-substrate connection and a trench gate, comprising a semiconductor substrate of a first conductivity type; a semiconductor layer of the first conductivity type disposed on the semiconductor substrate, the semiconductor layer having first and second surfaces; a drain zone of the first conductivity type disposed on the first surface of the semiconductor layer; a trench gate substantially penetrating the semiconductor layer, the trench gate having an end and defining a region next to the trench gate on the second surface of the semiconductor layer; a source zone of the first conductivity type disposed at the end of the trench gate on the second surface of the semiconductor layer, the source zone having a surface; a semiconductor zone of the second conductivity type disposed in the region next to the trench gate on the second surface of the semiconductor layer, the semiconductor zone having a surface forming the second surface of the semiconductor layer together with the surface of the source zone; and a buried highly conductive layer disposed between the second surface of the semiconductor layer and the semiconductor substrate.

This highly conductive layer, which can, for instance, be formed of silicide or titanium nitride, furnishes a nearly full or full ohmic contact with both the source zone and the semiconductor layer of the second conductivity type, is resistant to high temperatures so as not to be impaired by the ensuing process steps for production of the FET, and readily allows wafer bonding, in which a semiconductor substrate and a semiconductor layer are joined together on their bonding surfaces through the use of the highly conductive layer, that is applied to one of these bonding surfaces.

Instead of a silicide or titanium nitride, a layer being formed of polycrystalline silicon can also be used. The polycrystalline silicon is doped with a dopant of the first conductivity type. Preferably, the semiconductor zone of the second conductivity type is so highly doped that a pn junction extends within the polycrystalline highly conductive layer.

The semiconductor substrate, on which the semiconductor layer is applied by direct bonding, is formed of highly conductive silicon or a plurality of silicon layers.

As already indicated above, a wafer bonding surface can extend between the semiconductor substrate and the highly conductive layer, or between the semiconductor layer and the highly conductive layer. In the first instance, the highly conductive layer is first applied to the semiconductor layer, so that the semiconductor layer provided with the highly conductive layer is wafer-bonded to the semiconductor substrate. In the latter case, the highly conductive layer is disposed on the semiconductor substrate, and therefore the semiconductor layer is wafer-bonded to the semiconductor substrate that is provided with the highly conductive layer. Typical dimensions for the various layer thicknesses are as follows: for the semiconductor layer, 5 to 10 $\mu$m; for the drain zone, below 1 $\mu$m; for the highly conductive layer, approximately 0.01 $\mu$m; for the semiconductor substrate, 50 to 200 $\mu$m; for the semiconductor zone of the second conductivity type, 2 to 5 $\mu$m; for the source zone, 1 to 3 $\mu$m; and for the drain metallizing, 1 to 5 $\mu$m, and in particular 3 $\mu$m.

The semiconductor zone of the second conductivity type in the region adjoining the highly conductive layer is preferably highly doped.

It is also possible for a plurality of gates to be connected in parallel. A gate electrode placed at the edge is grounded to increase the voltage strength of the edge. In order to increase the voltage strength, polycrystalline silicon fillings of the gates can also have hat-like lateral extensions in the region of an insulating layer disposed on the semiconductor layer, which provide for a field course that improves the voltage strength.

The semiconductor substrate can be formed of monocrystalline or polycrystalline silicon, which is doped with a dopant of the first conductivity type.

Preferred methods for producing the FETs with a source-substrate connection and a trench gate are distinguished in that either a semiconductor wafer provided with the highly conductive layer is wafer-bonded to the semiconductor substrate, or that the semiconductor substrate provided with the highly conductive layer is wafer-bonded to the semiconductor layer. In both methods, after the wafer bonding, the individual doping and etching steps are then performed in the usual way:

Initially, a first semiconductor wafer of the first conductivity type is provided by epitaxy or diffusion with a zone of the second conductivity type. Next, highly doped regions of the first conductivity type, which are intended to form the source zone, are made in this wafer. After flat polishing of the surface opposite the source zone of this first semiconductor wafer, the highly conductive layer is applied over it, as a short-circuit later between the source zone and the semiconductor zone of the second conductivity type ("body" region), and the wafer bonding is performed by using a second wafer as a substrate.

As already noted above, the highly conductive layer need not be provided on the first semiconductor wafer. On the contrary, it may also be disposed on the second semiconductor wafer.

It is essential for the highly conductive layer, that it be capable of creating a nearly full or full ohmic contact equally well with highly conductive layers of the first and the second conductivity type, that it be resistant to high temperature so that it can survive subsequent process steps, and that it enable direct wafer bonding between the two semiconductor wafers, one of which forms the semiconductor layer and the other of which forms the semiconductor substrate.

After the two semiconductor wafers have been bonded, the first semiconductor wafer forming the semiconductor layer can be thinned and smoothed, which is expedient for trench etching and further preparation. Next, trench gates are etched; the drain zones are introduced by diffusion or implantation; and finally, a metallizing, for instance of aluminum, is applied.

As the final process block, the second semiconductor wafer, which forms the semiconductor substrate, can be thinned and metallized, and a cooling lug or vane, for instance, can be mounted on it.

Since the adjustment of the two semiconductor wafers to one another before they are bonded is of great significance, it is possible by anisotropic etching to produce pyramid-shaped trenches in the first semiconductor wafer, for instance, and to fill them partly or entirely with polycrystalline silicon which is highly doped with dopant of the first conductivity type. The peaks of the pyramid, which appear after the wafer bonding and thin-grinding of the first semiconductor wafer, can then be used as adjustment marks in the process block in which the trenches are etched.

It has already been noted that silicide or titanium nitride is a particularly preferred material for the highly conductive layer.

However, it is also possible, instead of silicide or titanium nitride, to use a polycrystalline silicon layer, which is highly doped with dopant of the first conductivity type. Such a polycrystalline silicon layer not only makes a low-impedance contact with the highly doped source zone of the first conductivity type and with the semiconductor substrate, but also has a usable ohmic contact with the highly doped zone of the second conductivity type and the so-called "body" region of the FET. The doping of the highly doped zone of the second conductivity type should be so high that in the outward diffusion during the production process, a pn junction is created in the polycrystalline silicon layer that forms the highly conductive layer. Highly doped pn junctions in polycrystalline silicon in fact have an ohmic characteristic. The use of highly doped polycrystalline silicon of the first conductivity type for the highly conductive layer is especially advantageous, because it can be accomplished simply and with conventional production methods.

Other features which are considered as characteristic for the invention are set forth in the appended claims.

Although the invention is illustrated and described herein as embodied in an FET with a source-substrate connection and a method for producing the FET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a fragmentary, cross-sectional view of a fourth exemplary embodiment of the FET of the invention with a source-substrate connection, in this case with a strongly short-circuited "body" zone;

FIG. 6 is a fragmentary, cross-sectional view of a fifth exemplary embodiment of the FET of the invention with a source-substrate connection, showing how a plurality of FETs with a common source can be connected parallel and how an edge structure is to be constructed;

DESCRIPTION OF THE PREFERRED EMBODIMENTS

Figure 1:
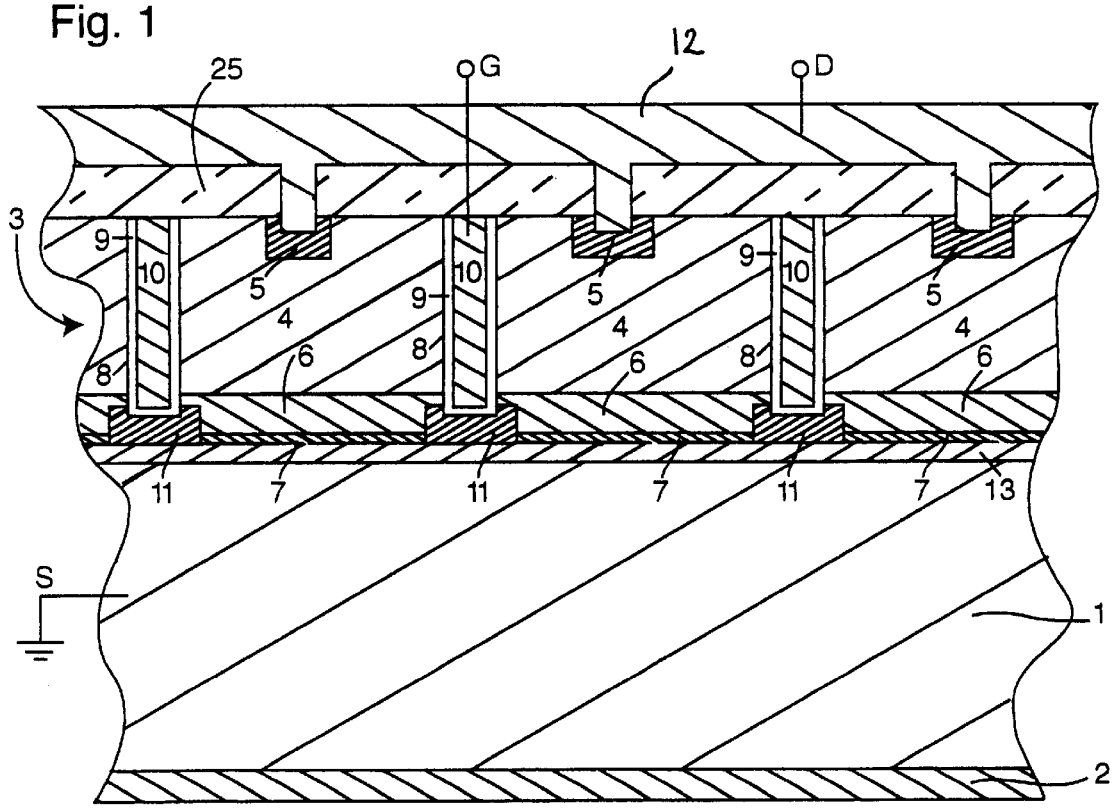
FIG. 1 is a fragmentary, diagrammatic, cross-sectional view of a first exemplary embodiment of an FET of the invention with a source-substrate connection.

Referring now in detail to the figures of the drawings, in which components corresponding to one another are identified by the same reference numerals, and first, particularly, to FIG. 1 thereof, there is seen a highly conducting silicon substrate 1, which acts as a source s that can be grounded in the FET. The silicon substrate 1 can optionally also be formed of a plurality of layers, which are created by epitaxy or diffusion.

A metallizing 2 which can also be provided with a cooling lug or vane is applied over a lower surface of the silicon substrate 1, as is seen in FIG. 1.

In the present exemplary embodiment as well as in ensuing exemplary embodiments, the silicon substrate 1 is n+-conducting, or in other words has a first conductivity type. It is understood that the conductivity types can also be reversed.

A semiconductor layer 3 is applied on a surface of the silicon substrate 1 opposite the metallizing 2 by wafer bonding. This semiconductor layer 3 is also referred to as a first semiconductor wafer, while the silicon substrate 1 is referred to as a second semiconductor wafer. The semiconductor layer 3 has an n-conducting silicon region 4, in which $n^+$-conducting drain zones 5 are made in the surface opposite the silicon substrate 1. A p-conducting drain zone 6, which may be provided with a $p^+$-conducting zone 7, is located opposite the silicon substrate 1.

Trenches 8 are made by etching from the surface of the semiconductor layer 3 into the silicon of the semiconductor layer 3 and are filled with an insulating layer 9 of silicon dioxide as well as $n^+$-conducting polycrystalline silicon 10. This polycrystalline silicon 10 forms a gate electrode G.

It is seen that $n^+$-conducting source zones 11 are provided in a region below the trenches 8, so that the p-conducting semiconductor zone 6 forms a "body" region of the FET.

The drain zones 5 are connected to a metallizing 12, which represents a drain electrode D. The metallizing 12 protrudes through an insulating layer 25 disposed on the semiconductor layer 3.

A highly conductive layer 13 acting as a short-circuit layer between the source zones 11 and the $p^+$-conducting regions 7 and as a bonding layer with the silicon substrate 1, is applied to a plane surface of the source zones 11 and the $p^+$-conducting region 7 or the p-conducting semiconductor zone 6. This highly conductive layer preferably is formed of a silicide or titanium nitride. The layer 13 thus makes a nearly full or full ohmic contact with the $n^{30}$-conducting and $p^{30}$-conducting or p-conducting zones, such as the source zones 11, the $p^{30}$-conducting region 7 and the silicon substrate 1. The layer 13 is resistant to high temperature so that it can survive process steps subsequent to its application and it enables the wafer bonding between the first semiconductor wafer, which in particular is formed of the silicon semiconductor layer 3, and the silicon substrate 1.

It is also possible to select $n^{30}$-conducting polycrystalline silicon for the highly conductive layer 13, or a material that is similar in its properties to silicide, titanium nitride, and $n^{30}$-conducting polycrystalline silicon.

Figure 2:
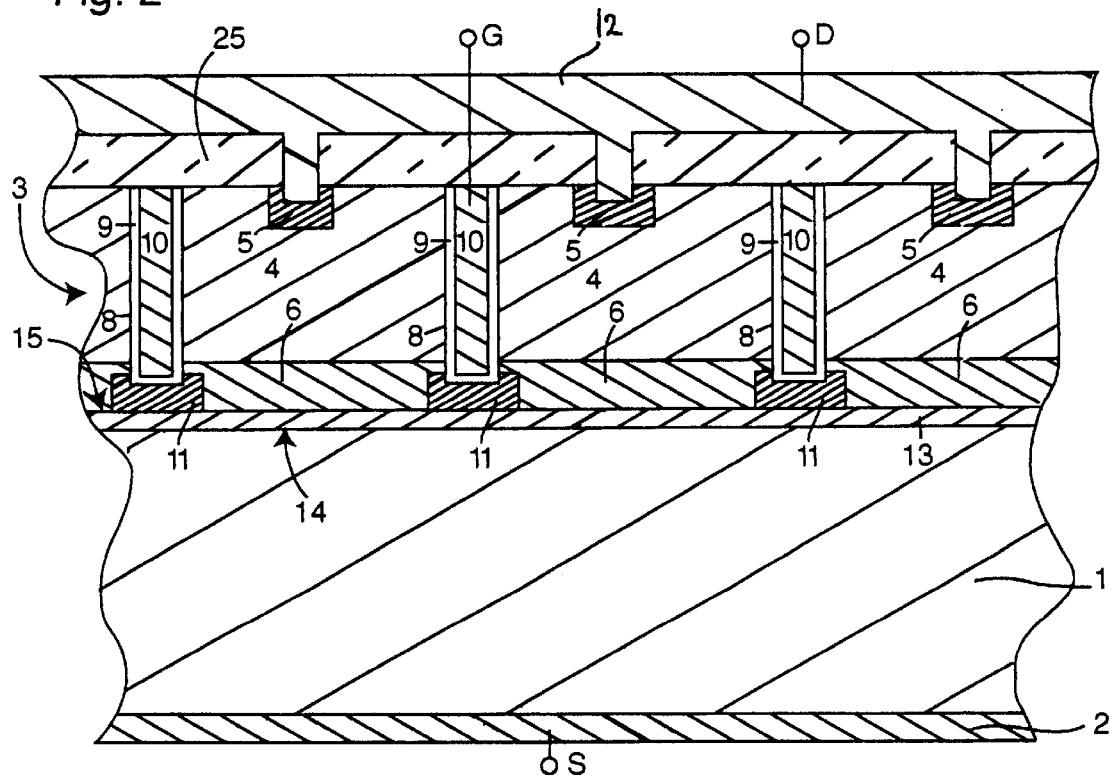
FIG. 2 is a fragmentary, cross-sectional view of a second exemplary embodiment of the FET of the invention with a source-substrate connection, in which it is particularly shown where possible direct wafer bonding surfaces are located.

FIG. 2 shows a second exemplary embodiment of the FET of the invention with a source-substrate connection, but in this case the $p^{30}$-conducting region 7 has been left out.

The highly conductive layer 13 has surfaces 14 and 15 which are possible bonding surfaces for the direct wafer bonding. If the surface 14 is chosen, then the highly conductive layer 13 is applied to the first semiconductor wafer having the semiconductor layer 3, and direct wafer bonding is then performed to the silicon substrate 1. If conversely the surface 15 is chosen, then the highly conductive layer 13 is initially applied to the silicon substrate 1, and the wafer bonding to the first semiconductor wafer or semiconductor layer 3 is then performed.

Figure 3:
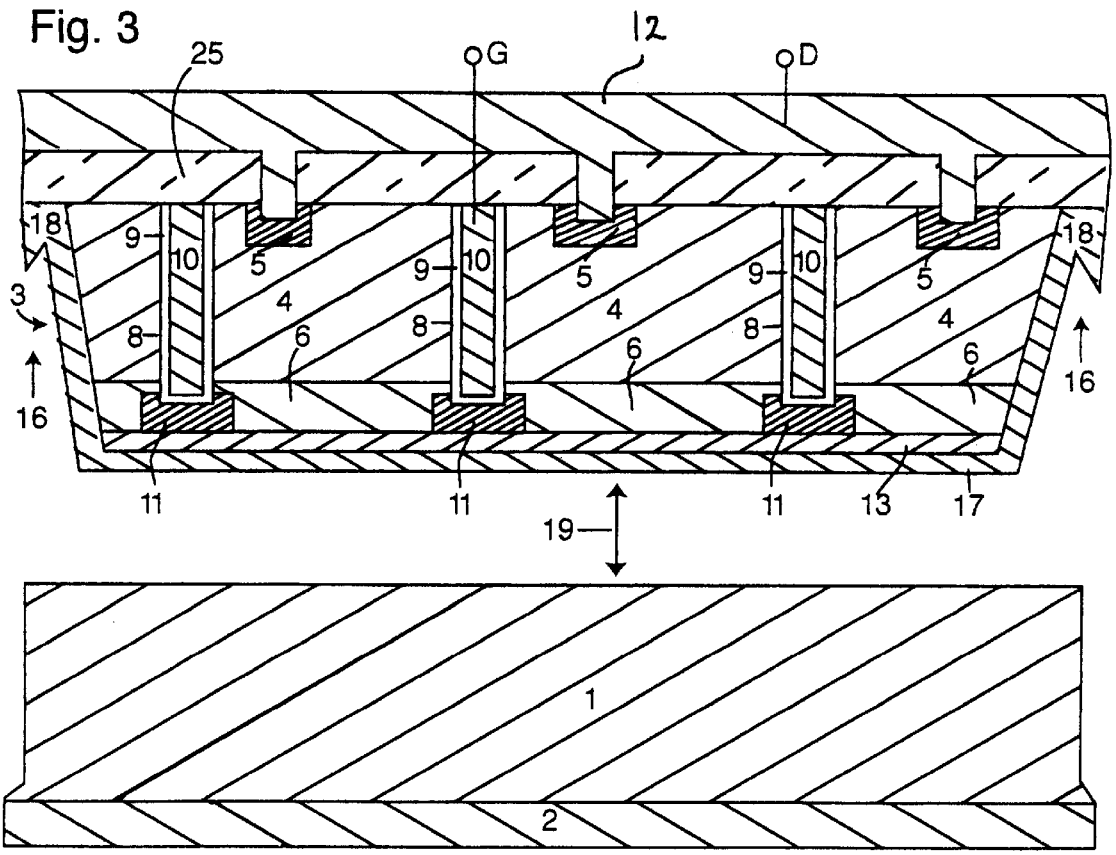
FIG. 3 is an exploded, cross-sectional view used to explain a method for producing the FET with the source-substrate connection according to the invention.

FIG. 3 shows how an adjustment of the FET of the invention can be performed: pyramid-shaped trenches 16 are made in the first semiconductor wafer by anisotropic etching before the wafer bonding of the first semiconductor wafer, in particular of the silicon semiconductor layer 3. These trenches 16 are then filled entirely or partially with $n^{30}$-conducting polycrystalline silicon 17. Peaks 18 of the pyramid, which appear after the wafer bonding of the first semiconductor wafer 3 to the semiconductor substrate 1 and thin grinding of the first semiconductor wafer, then serve as adjustment marks for an ensuing making of the trenches in a so-called trench process block. It should be noted that in FIG. 3, these trenches 8 are shown as already being provided with the insulating layer 9 and the fillings 10 even though the corresponding structures are not made until after the direct wafer bonding has been carried out (see the double arrow 19).

In the production of the FET, the first semiconductor wafer of n-conducting silicon is provided with the p-conducting semiconductor zone 6 by epitaxy or diffusion. Next, the $n^{30}$-conducting source zones 11 are made, and then the surface, which is highly polished before hand, is provided with the highly conductive layer 13 acting as the short-circuit layer.

This is followed by the wafer bonding, and it should be noted once again that the highly conductive layer 13 may also be applied to the silicon substrate 1. After the wafer bonding, the semiconductor wafer, that in particular is formed of the semiconductor layer 3, is thinned and smoothed, which is necessary for the trench etching and further preparation. The trenches 8 are then made along with the insulating layer 9 and the polycrystalline silicon 10. Finally, the drain zones 5 are also made, and the metallizing 12 for the drain zones 5 is applied.

Figure 4:
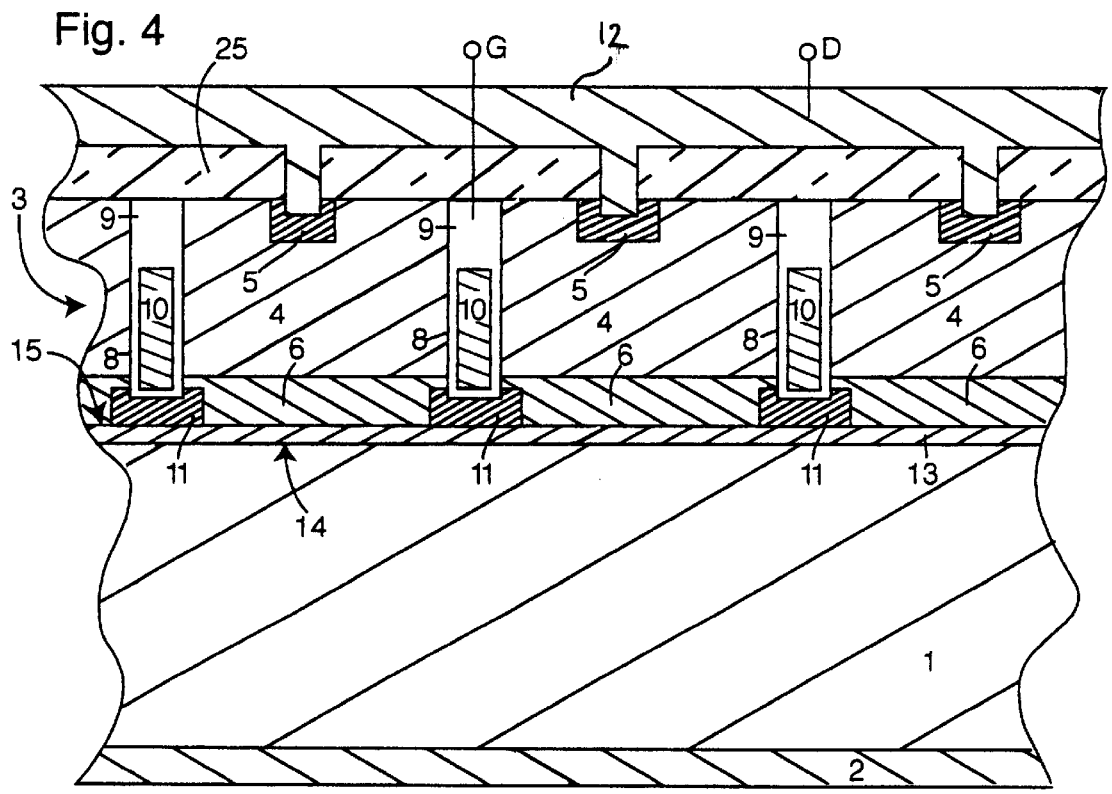
FIG. 4 is a fragmentary, cross-sectional view of a third exemplary embodiment of the FET of the invention with a source-substrate connection, in which deeply etched trench gates are provided to make the FET suitable for higher voltages.

FIG. 4 shows a third exemplary embodiment of the FET of the invention. In this case the trench gates 8 are deeply etched, which is expedient particularly for operation at higher voltages.

The following values can be indicated both for this exemplary embodiment and for the other exemplary embodiments as expedient dimensions: a layer thickness of the semiconductor substrate 1 of approximately 200 $\mu$m; a layer thickness of the highly conductive layer 13 of approximately 0.01 $\mu$m; a thickness of the source zone 11 below the trench 8 of approximately 1 to 3 $\mu$m; a layer thickness of the semiconductor zone 6 of the second conductivity type of approximately 2 to 5 $\mu$m; a layer thickness of the semiconductor layer 3 with the n-conducting region and the p-conducting semiconductor zone 6 of approximately 5 to 10 μm; a thickness or penetration depth of the drain zone 5 of less than 1 μm; and a layer thickness of the metallizing 12 of approximately 3 μm. A spacing between the individual trenches 8 can be approximately 5 μm.

The above-mentioned values are merely guideline variables and are not intended to limit the present invention in any way. On the contrary, these values may be exceeded or undershot in both directions.

FIG. 5 shows a fourth exemplary embodiment of the FET of the invention, which has a strongly short-circuited "body" zone. In this case the semiconductor zone 6 is highly doped with p+ in one region 20 and has lower doping in an actual channel region 21. Otherwise, this exemplary embodiment is equivalent to the exemplary embodiment of FIG. 2.

FIG. 6 shows a fifth exemplary embodiment that is similar to FIG. 5, but in which a plurality of FETs are interconnected with their gate electrodes, while one gate electrode is connected to ground in order to increase voltage strength of an edge. The parallel-connected FETs in this case have a common source S.

Figure 7:
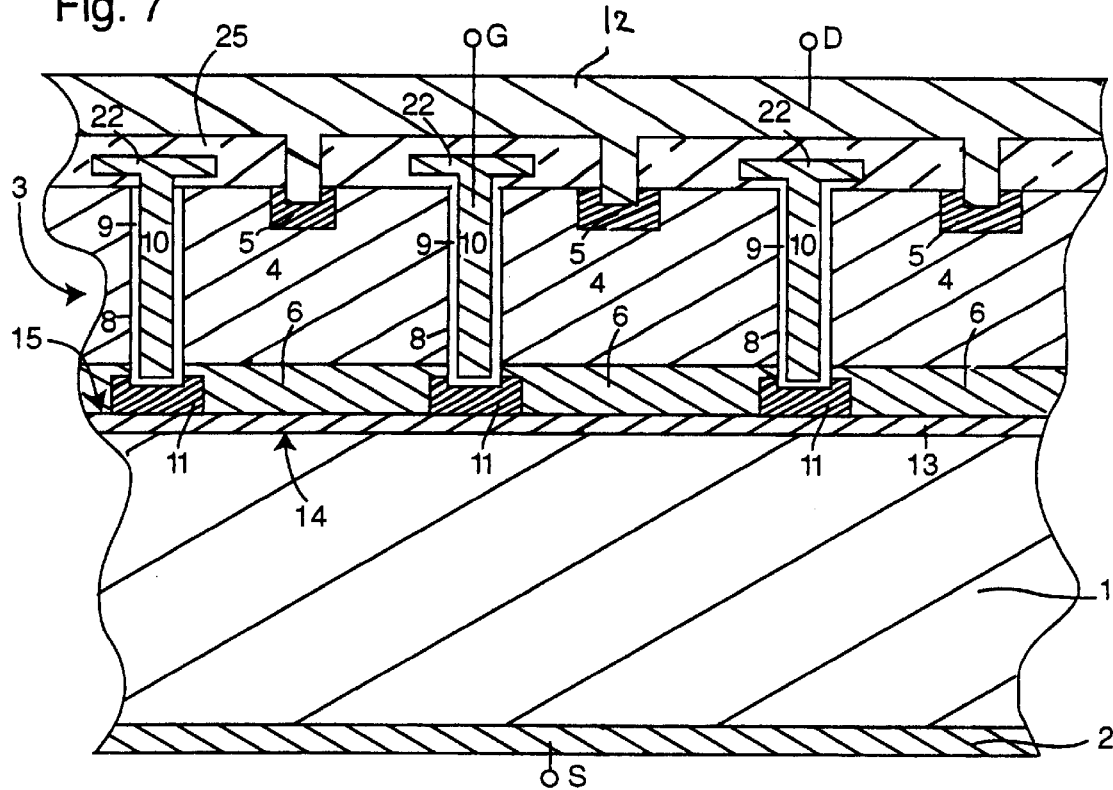
FIG. 7 is a fragmentary, cross-sectional view of a sixth exemplary embodiment of the FET of the invention with a source-substrate connection, in which gate fillings are provided with hat-like structures.

FIG. 7 shows a sixth exemplary embodiment that is similar to FIG. 2, in which the polycrystalline silicon 10 above the trenches 8 has a hat-like structure 22, so that the polycrystalline silicon 10 extends past the edge of the trenches 8 due to this structure 22. A field line distribution which is thus attained improves the voltage strength of the FET.

While in the exemplary embodiments of FIGS. 1 through 7 silicide or titanium nitride is preferably used for the highly conductive layer 13, exemplary embodiments will be presented below that preferably use $n^{30}$-conducting polycrystalline silicon for the highly conductive layer 13, which will now be referred to as a layer 23. However, it must be emphasized that in the exemplary embodiments of FIGS. 1 through 7 as well, $n^{30}$-conducting polycrystalline silicon can be used for the layer 13, while it is also understood that the following exemplary embodiments of FIGS. 8 through 10 may be provided with silicide or titanium nitride for the highly conductive layer 23.

Figure 8:
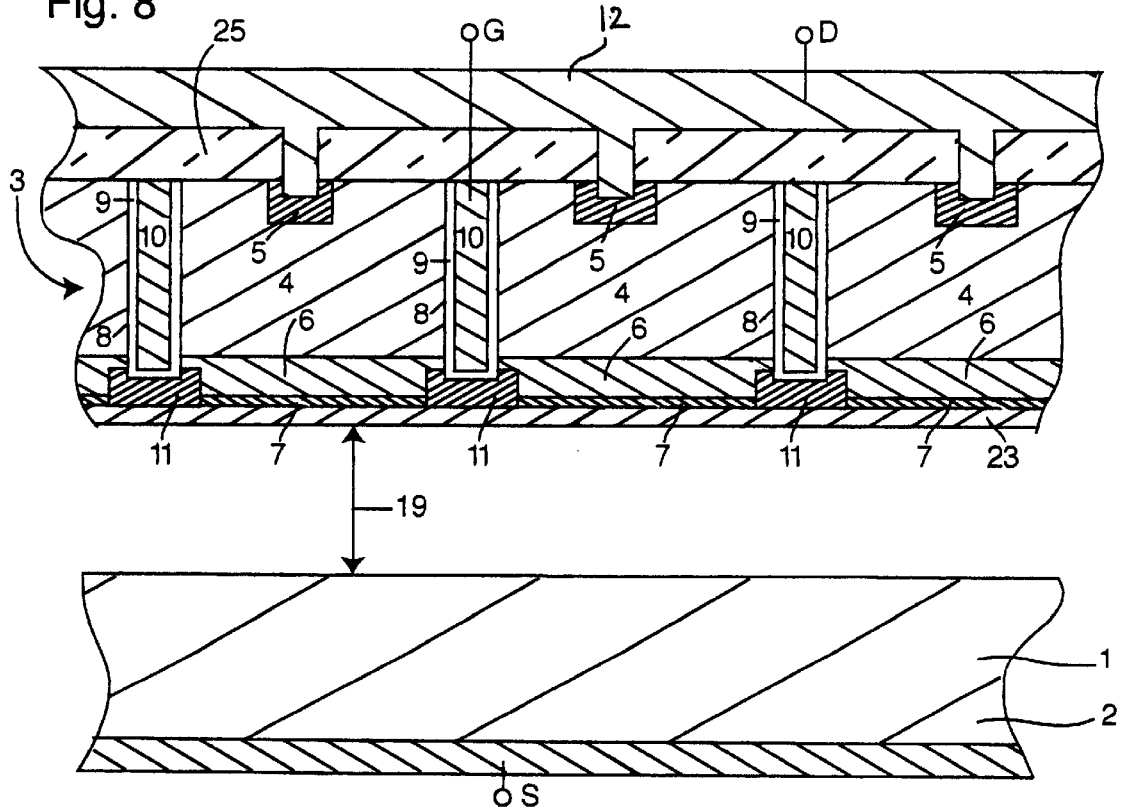
FIG. 8 is an exploded, fragmentary, cross-sectional view used to explain how an FET with a source-substrate connection in accordance with a seventh exemplary embodiment of the present invention should be produced.

FIG. 8 thus shows a seventh exemplary embodiment that is similar to FIG. 1, but in which instead of the highly conductive layer 13 of silicide or titanium nitride or some similar material, an $n^{30}$-conducting polycrystalline silicon 23 is provided, with which the direct wafer bonding to the silicon substrate 1 is performed (see the double arrow 19).

Figure 9:
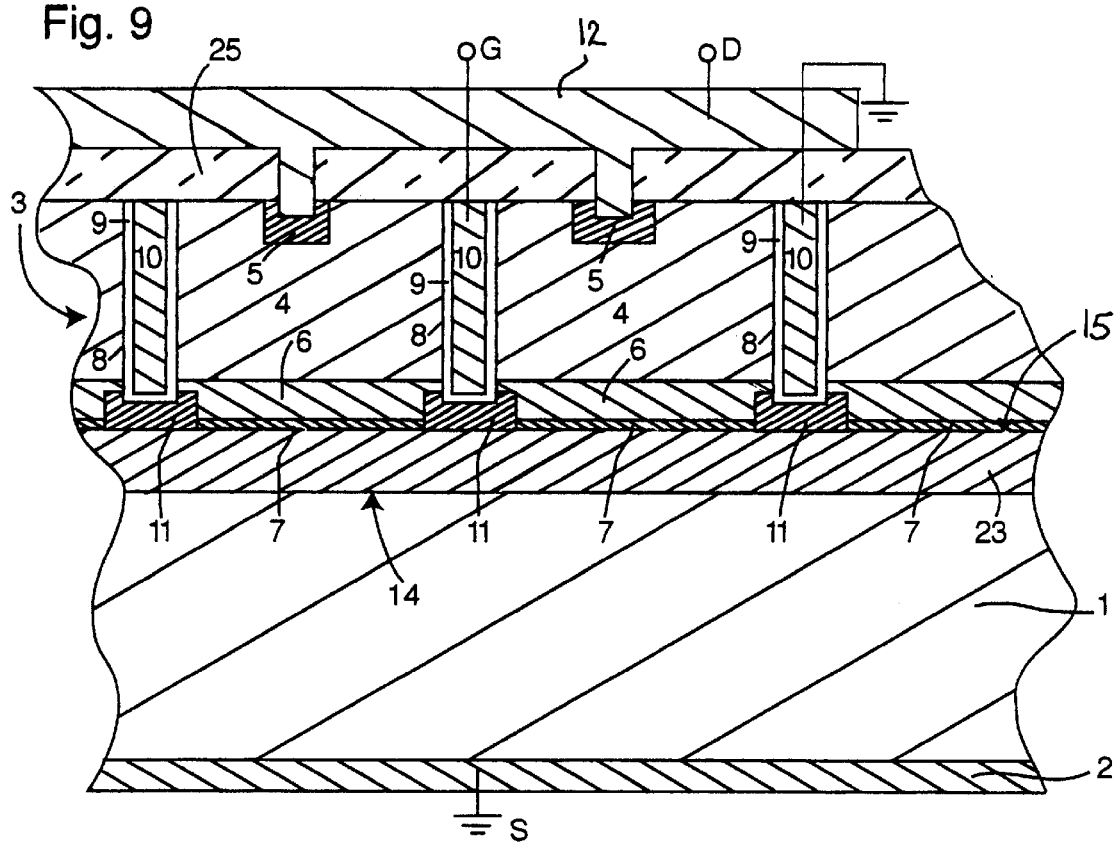
FIG. 9 is a fragmentary, cross-sectional view of an eighth exemplary embodiment of the FET of the invention with a source-substrate connection, in which an advantageous edge termination is shown.

FIG. 9 shows an eighth exemplary embodiment that is similar to FIG. 8, in which in addition, an edge termination similar to FIG. 6 is provided through the use of a grounded gate electrode. The possible bonding surfaces 14 and 15 are also shown, corresponding to the exemplary embodiment of FIG. 2.

Figure 10:
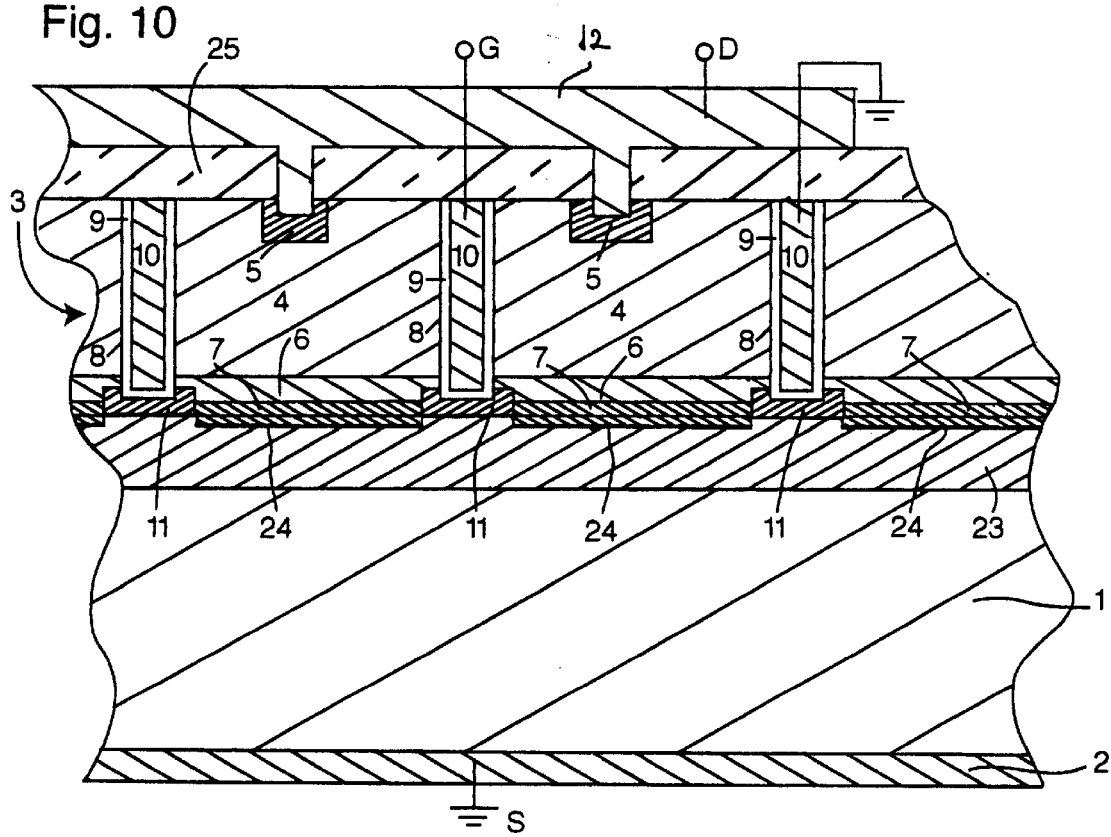
FIG. 10 is a fragmentary, cross-sectional view of a ninth exemplary embodiment of the FET of the invention with a source-substrate connection, in which a location of a pn junction and a highly conductive layer of polycrystalline silicon is shown.

Finally, FIG. 10 shows a ninth exemplary embodiment that is similar to FIG. 8. It is shown in this case that the $p^{30}$-conducting region 7 is preferably so highly doped that a pn junction 24, which is formed by outward diffusion during the production process, extends in the vicinity of the polycrystalline silicon of the highly conductive layer 23. Highly doped pn junctions and polycrystalline silicon in fact have an ohmic-characteristic, which is advantageous in the present case.

We claim:

1. An FET with a source-substrate connection and a trench gate, comprising:
   a semiconductor substrate of a first conductivity type;
   a semiconductor layer of the first conductivity type disposed on said semiconductor substrate, said semiconductor layer having first and second surfaces;
   a drain zone of the first conductivity type disposed on said first surface of said semiconductor layer;
   a trench gate substantially penetrating said semiconductor layer, said trench gate having an end and defining a region next to said trench gate on said second surface of said semiconductor layer;
   a source zone of the first conductivity type disposed at said end of said trench gate on said second surface of said semiconductor layer, said source zone having a surface;
   a semiconductor zone of the second conductivity type disposed in said region next to said trench gate on said second surface of said semiconductor layer, said semiconductor zone having a surface forming said second surface of said semiconductor layer together with said surface of said source zone; and
   a buried highly conductive layer disposed between said second surface of said semiconductor layer and said semiconductor substrate.

2. The FET according to claim 1, wherein said highly conductive layer is formed of a material forming an ohmic contact with said source zone and said semiconductor zone of the second conductivity type.

3. The FET according to claim 2, wherein said material is selected from the group consisting of silicide, titanium nitride and a similar material.

4. The FET according to claim 1, wherein said highly conductive layer is formed of polycrystalline silicon doped with a dopant of the first conductivity type.

5. The FET according to claim 4, wherein said semiconductor zone of the second conductivity type is doped high enough to create a pn junction extending within said polycrystalline highly conductive layer.

6. The FET according to claim 1, wherein said semiconductor substrate is formed of highly conductive silicon.

7. The FET according to claim 1, wherein said semiconductor substrate is formed of a plurality of silicon layers.

8. The FET according to claim 1, including a wafer bonding surface extending between said semiconductor substrate and said highly conductive layer.

9. The FET according to claim 1, including a wafer bonding surface extending between said semiconductor layer and said highly conductive layer.

10. The FET according to claim 1, wherein said semiconductor substrate has a layer thickness of from 5 to 10 μm.

11. The FET according to claim 1, wherein said drain zone has a thickness or penetration depth below 1 μm.

12. The FET according to claim 1, wherein said highly conductive layer has a layer thickness of approximately 0.01 μm.

13. The FET according to claim 1, wherein said semiconductor substrate has a layer thickness of from 50 to 200 μm.

14. The FET according to claim 1, wherein said semiconductor zone of the second conductivity type has a layer thickness of from 2 to 5 μm.

15. The FET according to claim 1, wherein said source zone has a thickness or penetration depth of from 1 to 3 μm.

16. The FET according to claim 1, including a drain metallizing having a layer thickness of from 1 to 5 μm.

17. The FET according to claim 1, including a drain metallizing having a layer thickness of 3 μm.

18. The FET according to claim 1, wherein said trench gate is one of a plurality of adjacent trench gates having a mutual spacing of approximately 5 μm.

19. The FET according to claim 1, including a region adjoining said highly conductive layer, said semiconductor zone of the second conductivity type being highly doped in said region.

20. The FET according to claim 1, including a plurality of gates connected in parallel and a grounded edge gate.

21. The FET according to claim 1, wherein said trench gate is one of a plurality of adjacent trench gates, an insulating layer is disposed on said semiconductor layer, and polycrystalline silicon fillings in said trench gates have hat-like lateral extensions in the vicinity of said insulating layer.

22. The FET according to claim 1, wherein said semiconductor substrate is formed of a material selected from the group consisting of monocrystalline silicon and polycrystalline silicon.

23. A method for producing the FET according to claim 1, which comprises:

wafer-bonding said semiconductor wafer provided with said highly conductive layer to said semiconductor substrate.

24. A method for producing the FET according to claim 1, which comprises:

wafer-bonding said semiconductor substrate provided with said highly conductive layer to said semiconductor layer.

25. The method according to claim 23, which comprises mounting a pyramid-like polycrystalline silicon structure on said semiconductor substrate before the wafer bonding step, to provide exposed peaks of said pyramid-like structure to be utilized as adjustment markings after said semiconductor substrate has been ground thin.

26. The method according to claim 24, which comprises mounting a pyramid-like polycrystalline silicon structure on said semiconductor substrate before the wafer bonding step, to provide exposed peaks of said pyramid-like structure to be utilized as adjustment markings after said semiconductor substrate has been ground thin.

* * * * *